United States Patent [19]

Kapoor

[11] Patent Number: 4,982,244
[45] Date of Patent: Jan. 1, 1991

[54] BURIED SCHOTTKY CLAMPED TRANSISTOR

[75] Inventor: Ashok K. Kapoor, Palo Alto, Calif.

[73] Assignee: National Semiconductor Corporation, Santa Clara, Calif.

[21] Appl. No.: 450,896

[22] Filed: Dec. 20, 1982

[51] Int. Cl.$^5$ .................. H01L 29/54; H01L 29/56
[52] U.S. Cl. ........................ 357/15; 357/71; 357/67
[58] Field of Search ............ 357/71 S, 55, 15, 50, 357/67 S, 71, 13

[56] References Cited

U.S. PATENT DOCUMENTS

| | | | |
|---|---|---|---|
| 3,290,127 | 12/1966 | Kahng et al. | 357/71 S |
| 3,623,925 | 1/1969 | Jenkins et al. | 148/188 |
| 3,729,406 | 4/1973 | Osborne et al. | 357/71 S |
| 3,737,742 | 6/1973 | Breuer et al. | 357/15 |
| 3,742,317 | 6/1973 | Shao | 357/15 |
| 3,770,606 | 11/1973 | Lepselter | 204/192 |
| 3,878,552 | 4/1975 | Rodgers | 357/15 |
| 3,906,540 | 9/1975 | Hollins | 357/71 S |
| 4,212,256 | 7/1980 | Dalal et al. | 357/71 |
| 4,214,256 | 7/1980 | Dalal et al. | 357/67 S |
| 4,228,371 | 10/1980 | Mazgy | 357/15 |
| 4,361,599 | 11/1982 | Wourms | 357/71 S |
| 4,446,476 | 5/1984 | Isaac et al. | 357/71 S |
| 4,458,410 | 7/1984 | Sugaki et al. | 357/71 S |

FOREIGN PATENT DOCUMENTS

| | | | |
|---|---|---|---|
| 1002208 | 12/1976 | Canada | 356/53 |
| 1044817 | 12/1978 | Canada | 356/153 |
| 0034907 | 11/1975 | Japan | 357/71 S |
| 0113372 | 9/1980 | Japan | 357/71 |

OTHER PUBLICATIONS

Physics of Semiconductor Devices-2nd edition-S. M. Sze-Publisher Wiley and Sons, p. 292.
"Refractory Silicides for Integrated Circuits"-Myrarka-Am Vacuum Soc.-J. Vac. Sci. Technol. 17(4), Jul.-/Aug. 1980, pp. 775-792, Copyright-1981.
"High Performance Transistor"-Berndlmaier et al., vol. 19, No. 6, Nov. 1976-IBM Tech. Bulletin, pp. 2071-2072.
IBM Technical Disclosure Bulletin, vol. 23, No. 4, Sep. 1980, p. 1396, D. Tuman: "Integrated Schottky Barrier Transistor Design".
IBM Technical Bulletin, vol. 22, No. 10, Mar. 1980, L. Berenbaum et al.: "Metal Silicides for Schottky Barrier Diode Applications".
Thin Solid Films, vol. 93, No. 3/4, Jul. 1982, B.-Y. Tsaur et al.: "Effects of Interface Structure on the Electrical Characteristics of PtSi-Si Schottky Barrier Contacts".

Primary Examiner—Rolf Hille
Assistant Examiner—S. V. Clark
Attorney, Agent, or Firm—Lee Patch; Robert C. Colwell; Vernon A. Norviel

[57] ABSTRACT

A buried Schottky clamped transistor is described in which the Schottky diode comprises a region of metal silicide 24 in the epitaxial layer 15 adjacent the transistor. The structure includes an electrically isolated region of N type epitaxial silicon 15 having an upper surface, a region of metal silicide 24 formed in the epitaxial silicon 15 adjacent the upper surface, an emitter region 33 of first conductivity type also formed in the epitaxial silicon adjacent the upper surface, base region 29 of opposite conductivity type adjacent the upper surface which separates the emitter 33 from the metal silicide 24, and metal connections 37, 38 and 39 for making electrical connections to each of the regions of metal silicide 24, the emitter region 33, and the epitaxial silicon 15.

10 Claims, 2 Drawing Sheets

BURIED SCHOTTKY CLAMPED TRANSISTOR

BACKGROUND OF THE INVENTION

1. Field of the Invention

This invention relates to integrated circuit structures and to processes for fabricating them. In particular, the invention relates to a semiconductor structure in which a bipolar transistor and a Schottky diode are merged.

2. Description of the Prior Art

In the design and manufacture of integrated circuits, Schottky diodes and transistors are often connected as part of a larger circuit, for example, a logic gate. In the prior art these interconnections have been formed using conventional techniques such as fabricating the Schottky diode near the transistor to which it is to be connected, and then interconnecting the two components with a metal line. In some prior art techniques the Schottky diode has been formed on top of the silicon substrate in which one or more transistors are formed.

Furthermore, the Schottky clamped transistors of the prior art typically used heavily doped regions of boron, fabricated using conventional bipolar processing, for the base contact. The Schottky diode was then usually formed on additional epitaxial area adjacent to the base of the transistor. This structure resulted in an active transistor with an additional diode formed by the heavily doped base region, and a Schottky diode, both in parallel with the base-collector contacts of the transistor. The additional PN junction diode formed by the extrinsic base and epitaxial layer was a significant limitation on the switching speed of the transistor.

SUMMARY OF THE INVENTION

This invention overcomes the problems of prior art Schottky diode-transistor structures by providing a buried Schottky clamped transistor structure in which the Schottky diode and the transistor structure are merged. The merger of these structures enables their fabrication in a smaller area than previous devices, and nearly eliminates the extrinsic base resistance of the structure. In addition the sheet resistance of the base contact is reduced because the buried region forming the Schottky diode is used to contact the active base of the transistor. These features provide a transistor structure having higher operating speeds than prior art devices.

In the preferred embodiment an integrated circuit structure fabricated according to the invention includes a region of semiconductor material having an upper surface, a transistor having a base, an emitter, and a collector formed in the semiconductor material, and a region of a metal silicide formed adjacent the upper surface and in electrical contact with at least one of the base, emitter, and collector. Typically the Schottky diode is formed between the base and the collector of the bipolar transistor, and comprises a region of tantalum silicide.

In another embodiment an integrated circuit structure fabricated according to the invention includes an electrically isolated region of semiconductor material of first conductivity type having an upper surface, a first region of metal silicide formed in the region of semiconductor material adjacent the upper surface, a second region of first conductivity type in the semiconductor material adjacent the upper surface, a third region of opposite conductivity type separating the first region from the second region, and means for making connections to each of the first, second, and third regions.

In one embodiment a process for fabricating the merged Schottky clamped transistor of this invention includes the steps of: introducing into a first region of semiconductor material of first conductivity type a second region of metal silicide; forming a third region of opposite conductivity type in the first region contiguous to the second region; and forming a fourth region of first conductivity type in the third region, and not in contact with the second region. In the preferred embodiment the step of introducing comprises depositing the second region on a surface of the first region and diffusing the second region into the first region. Typically the first region will comprise a portion of an epitaxially deposited layer of semiconductor material, and the metal silicide will comprise tantalum silicide.

BRIEF DESCRIPTION OF THE DRAWINGS

FIG. 2 is a subsequent cross-sectional view after formation of a region of tantalum silicide.

FIG. 3 is a subsequent cross-sectional view after diffusion of the tantalum silicide into the epitaxial layer.

FIG. 4 is a subsequent cross-sectional view after formation of the base region of the transistor.

FIG. 5 is a subsequent cross-sectional view after formation of emitter and collector contact regions.

FIG. 6 is a subsequent cross-sectional view illustrating the completed structure.

DETAILED DESCRIPTION OF THE PREFERRED EMBODIMENTS

Figure 1:
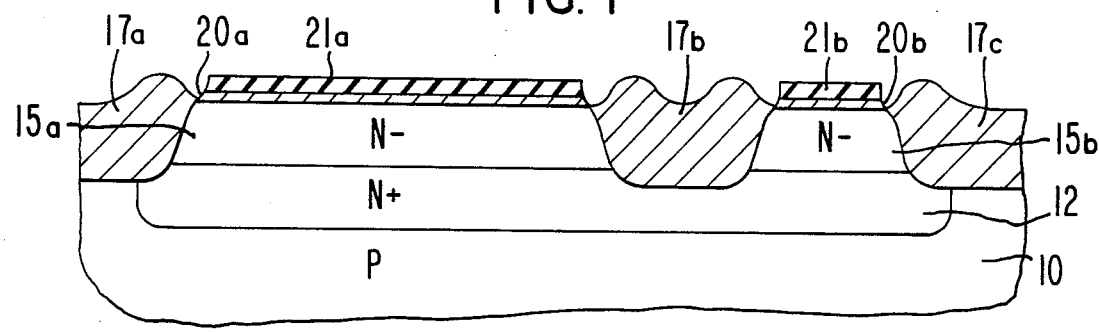
FIGS. 1 through 6 illustrate the process of this invention with FIG. 1 illustrating a cross-sectional view of a semiconductor structure which may be used as the starting point for the process.

FIG. 1 is a cross-sectional view of a semiconductor structure which may be fabricated using well-known process technology. The structure shown in FIG. 1 includes a P conductivity type 1-0-0 silicon substrate 10, an N conductivity type buried layer 12, and a lightly doped N conductivity type epitaxial layer 15, which has been divided into regions 15a and 15b by a region of oxidized silicon 17b. The regions of epitaxial layer 15a and 15b overlying buried layer 12 are electrically isolated from surrounding regions of the integrated circuit structure fabricated in substrate 10 by an annular region of oxidized silicon 17, of which cross-sections 17a and 17c are shown.

In the preferred embodiment substrate 10 has a resistivity of 10 ohms per centimeter, while buried layer 12 is doped to an impurity concentration of $10^{19}$ atoms per cubic centimeter with antimony. Epitaxial layer 15 has an impurity concentration of $10^{16}$ atoms per cubic centimeter of phosphorous, and in the preferred embodiment is 1.5 microns thick. Of course, as is well-known, these thicknesses and impurity concentrations may be altered to suit the desired characteristics of the completed integrated circuit structure.

On the upper surface of epitaxial layer 15, a relatively thin layer of silicon dioxide 20, on the order of 300 Angstroms thick, is formed by a thermal oxidation process. Typically, such a layer may be fabricated by heating the underlying structure in an oxygen ambient to a temperature of 1000° C. for 30 minutes. On the upper surface of silicon dioxide 20 a layer of silicon nitride 21 is deposited to a thickness of 1000 Angstroms, using well-known equipment.

Figure 2:
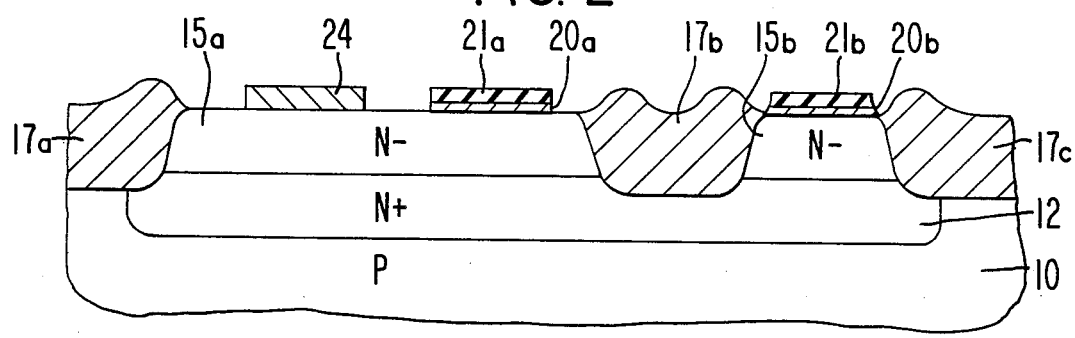

Using conventional photolithographic techniques, silicon nitride 21 is removed from all regions of the structure except for regions where the collector contact and the emitter of the bipolar transistor are to be formed. The resulting structure is shown in FIG. 2. In FIG. 2 silicon nitride 21a overlies the region of epitaxial layer 15a in which the emitter will be formed, while silicon nitride 21b overlies the portion of epitaxial layer 15b in which the collector contact will be formed.

Tantalum and silicon are then co-sputtered onto the surface of the epitaxial layer 15, to a thickness of about 2000 Angstroms. Using conventional photolithographic techniques the tantalum silicon mixture is masked and removed from undesired portions of the surface of the structure. As shown in FIG. 2, a region of tantalum-silicon 24 is left only on that portion of the epitaxial layer 15a where a Schottky diode is to be subsequently formed. In other embodiments of the invention, metals other than tantalum may be employed, such as molybednum, tungsten or titanium.

Figure 3:
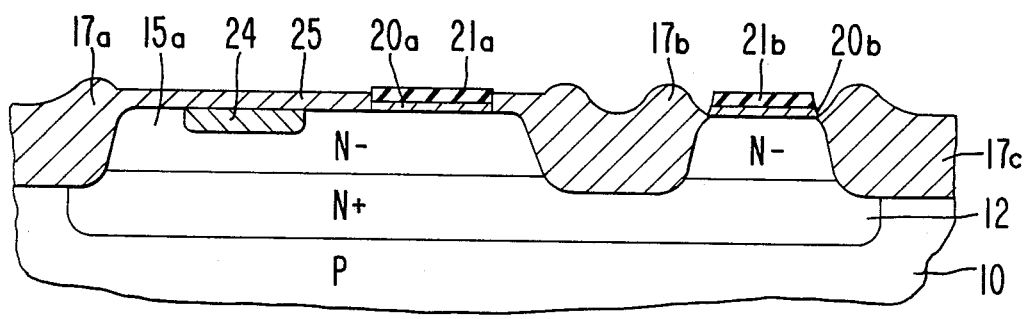

After patterning of region 24, the tantalum-silicon mixture is heat treated to form tantalum silicide. This process is carried out in an inert ambient at a temperature of approximately 950° C. for 30 minutes. Then the heat treatment is continued, but an oxidizing ambient is introduced to permit the formation of a layer of silicon dioxide 25 across the upper surface of the epitaxial layer 15 and on tantalum-silicide region 24. During this heat treatment, typically at a temperature of 950° C. for 100 minutes, the region of tantalum-silicide 24 will diffuse into epitaxial region 15a to form a rectifying contact with the N type epitaxial silicon 15a as shown in FIG. 3. Typically silicon dioxide 25 will be approximately 3500 Angstroms thick at the completion of this process.

Figure 4:
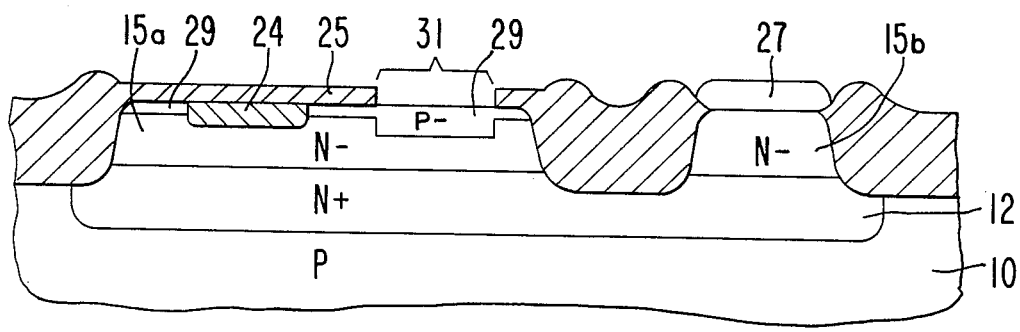

Silicon dioxide 20 and silicon nitride 21 are then removed from the surface of the epitaxial layer using conventional chemical or plasma etches. A layer of photoresist 27 is deposited and patterned to protect the collector contact region overlying epitaxial region 15b as shown in FIG. 4. The active base region 29 is then formed by implanting boron into epitaxial region 15a. By selecting an appropriate combination of implant energy and thickness of silicon dioxide 25, for example, 170 kev and 3500 Angstroms, respectively, the boron will penetrate the oxide around the tantalum silicide region 24 and form a guard ring, but will not penetrate the tantalum silicide region 24 itself. The absence of silicon dioxide in region 31 enables the boron to more deeply penetrate epitaxial layer 15a as shown. In the preferred embodiment the impurity concentration of the base region 29 will be $10^{17}$ atoms per cubic centimeter.

Figure 5:
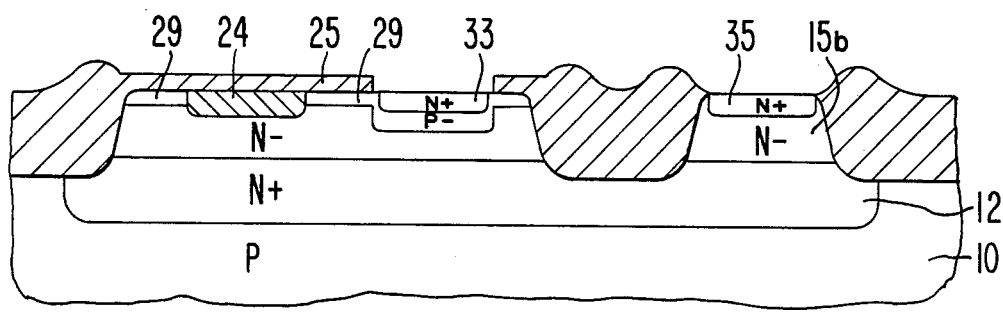

Photoresist 27 is removed and arsenic impurities are implanted or otherwise introduced to form emitter 33 and collector contact 35 as shown in FIG. 5. In the preferred embodiment an impurity concentration of $10^{20}$ atoms per cubic centimeter is used.

Figure 6:
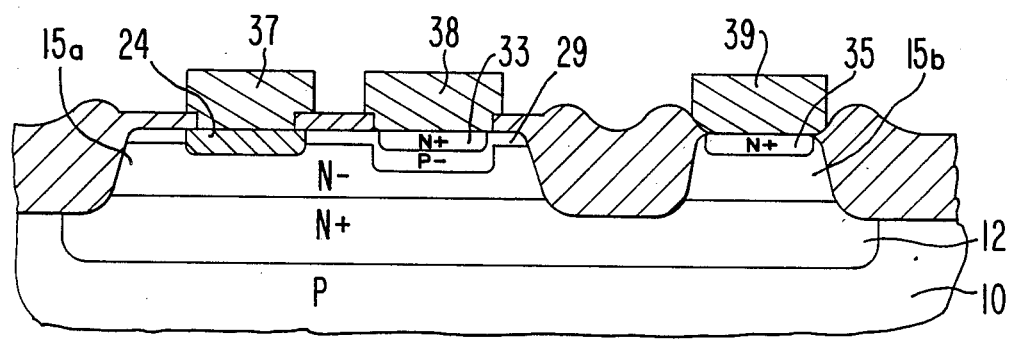

As shown in FIG. 6, an additional opening is made in silicon dioxide 25 to enable formation of metal contacts 37, 38 and 39 to the tantalum-silicide Schottky diode 24, emitter 33 and collector contact 35, respectively. Typically the metal will be aluminum (or a multilayer structure such as titanium, tungsten and aluminum) which is deposited in a layer approximately 7000 Angstroms thick and then patterned using well-known photolithographic and etching techniques.

Figure 7:
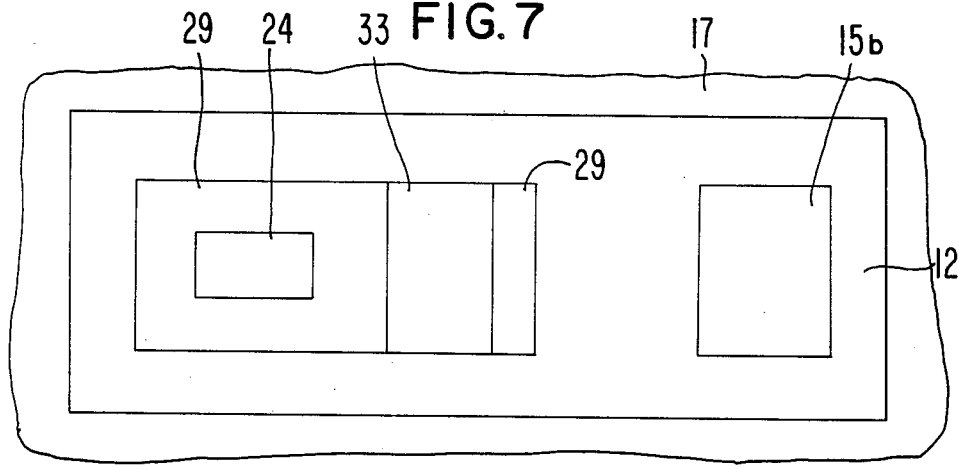
FIG. 7 is a top view of the structure shown in FIG. 6.

FIG. 7 is a top view of the structure shown in FIG. 6, but without metal contacts 37, 38, and 39. As shown in FIG. 7, buried layer 12 is surrounded by silicon dioxide insulation 17. Oxide 17, in conjunction with the P-N junction between buried layer 12 and substrate 10, will electrically isolate the portion of epitaxial layer 15 illustrated from surrounding portions of epitaxial material. The locations of collector contact 15b, emitter 33, base 29, and Schottky diode 24 are also shown.

Figure 8:
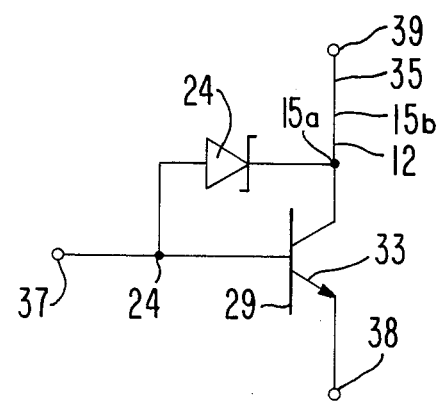
FIG. 8 is a schematic drawing of the equivalent discrete circuit formed by the structure shown in FIGS. 6 and 7.

FIG. 8 is an electrical schematic of a discrete circuit equivalent to the integrated circuit depicted in FIGS. 6 and 7. The reference numerals applied to the schematic in FIG. 8 correspond to those used in FIGS. 6 and 7. For example, in FIG. 8 the collector contact is metal 39, which is connected to Schottky diode 24 via collector contact 35, epitaxial region 15b, buried layer 12, and epitaxial region 15a. Similarly, base contact 37 is connected to base 29 through tantalum silicide 24.

The completed structure depicted in FIGS. 6 and 7 enables fabrication of buried Schottky clamped transistor in a smaller area of the wafer than prior art Schottky clamped transistors. The resulting circuit is useful in the manufacture of bipolar transistor logic circuits such as Schottky transistor logic. Furthermore because the tantalum-silicide itself forms the extrinsic base region, the P-N junction extrinsic base resistance is nearly eliminated. Lessening this resistance and the sheet resistance of the base contact enable faster overall operating speeds.

The foregoing is a description of the preferred embodiments of this invention. Numerous details, such as particular times, temperatures, and thicknesses, have been included to clarify and explain the invention, and should not be construed as limiting the invention, which is defined by the scope of the appended claims.

I claim:

1. A merged transistor-diode integrated circuit structure in a body of semiconductor material having a substantially planar upper surface, the structure comprising:
   a collector region of first conductivity type;
   a base region of opposite conductivity type in contact with the collector, the base region having a first portion extending along the substantially planar upper surface and extending into the semiconductor material a first distance, and having a second portion extending into the semiconductor material a second distance greater than the first distance;
   an emitter region of first conductivity type inset into the second portion of the base region; and
   an electrically conductive region inset into the substantially planar surface of the body, surrounded by and extending completely through the first portion of the base region to the collector region, the electrically conductive region being in electrical contact with both the first portion of the base region and the collector region, thereby forming a diode connected between the collector region and the base region.

2. A merged transistor-diode integrated circuit structure in a body of semiconductor material having a substantially planar upper surface, the structure comprising:
   a collector region of first conductivity type;
   an emitter region of first conductivity type inset into the body adjacent the planar surface;

an intervening base region of opposite conductivity type disposed between the collector region and the emitter region, a first portion of the base region extending along the planar surface adjacent the emitter region;

an electrically conductive region inset into the substantially planar surface of the body, surrounded by and extending completely through the first portion of the base region to the collector region, the electrically conductive region being in electrical contact with both the first portion of the base region and the collector region, thereby forming a diode connected between the collector region and the base region; and wherein the electrically conductive region comprises a metal silicide.

3. A structure as in claim 2 wherein an electrode is connected to the metal silicide to provide an ohmic electrical connection to the base region.

4. A structure as in claim 3 wherein the metal silicide comprises tantalum-silicide.

5. A structure as in claim 3 wherein the first conductivity type comprises N conductivity type.

6. A structure as in claim 1 wherein the diode comprises a Schottky diode.

7. A structure as in claim 6 further comprising a buried layer disposed beneath and in contact with the collector region.

8. A structure as in claim 7 wherein an ohmic electrical contact is made to the collector region by providing an electrical connection to the buried layer.

9. Structures in claim 8 wherein the buried layer is doped more strongly with first conductivity type than is the collector region.

10. A structure as in claim 1 wherein the collector region comprises an epitaxial layer of semiconductor material.

* * * * *